(12) United States Patent
De Vries et al.

(10) Patent No.: US 6,847,201 B2
(45) Date of Patent: Jan. 25, 2005

(54) COMPENSATION CIRCUIT FOR THE PHASE SHIFT IN ELECTRIC METERS FOR DIRECT CONNECTION

(75) Inventors: Jacob De Vries, Allenwinden (CH); Adrian Ulrich, Engelberg (CH)

(73) Assignee: Landis+Gyr AG, Zug (CH)

( * ) Notice: Subject to any disclaimer, the term of this patent is extended or adjusted under 35 U.S.C. 154(b) by 0 days.

(21) Appl. No.: 10/470,461
(22) PCT Filed: Jan. 24, 2002
(86) PCT No.: PCT/IB02/00207
§ 371 (c)(1),
(2), (4) Date: Jul. 29, 2003
(87) PCT Pub. No.: WO02/061441
PCT Pub. Date: Aug. 8, 2002

(65) Prior Publication Data
US 2004/0085786 A1 May 6, 2004

(30) Foreign Application Priority Data
Jan. 29, 2001 (DE) .................................. 101 04 064

(51) Int. Cl.$^7$ .............................................. G01B 11/02
(52) U.S. Cl. .................................. 324/138; 324/207.12
(58) Field of Search ................................. 324/126, 127, 324/138, 207.12, 207.15, 225

(56) References Cited

U.S. PATENT DOCUMENTS

| | | | | |
|---|---|---|---|---|
| 6,016,054 A | * | 1/2000 | Slater et al. | 324/142 |
| 6,208,135 B1 | * | 3/2001 | Shattil | 324/225 |
| 6,211,671 B1 | * | 4/2001 | Shattil | 324/225 |
| 6,590,380 B2 | * | 7/2003 | Edel | 324/127 |

* cited by examiner

Primary Examiner—Adolf Berhane
(74) Attorney, Agent, or Firm—Maginot, Moore & Beck

(57) ABSTRACT

The invention relates to a compensation circuit for the phase shift between a first input (3) for a voltage determination and a second input (4) for a current determination in electric meters for direct connection, whereby a DC-tolerant converter (5), for current transformation, is arranged before said second input (4) and a high pass filter (R1, C) is arranged before the first input (3), for a first equalisation of the non-frequency-dependant phase compensation. A further equalisation of the phase compensation occurs by means of a correction device (5) in a measuring chip (2), which is connected in series with the inputs (3, 4) for voltage determination and current determination.

17 Claims, 1 Drawing Sheet

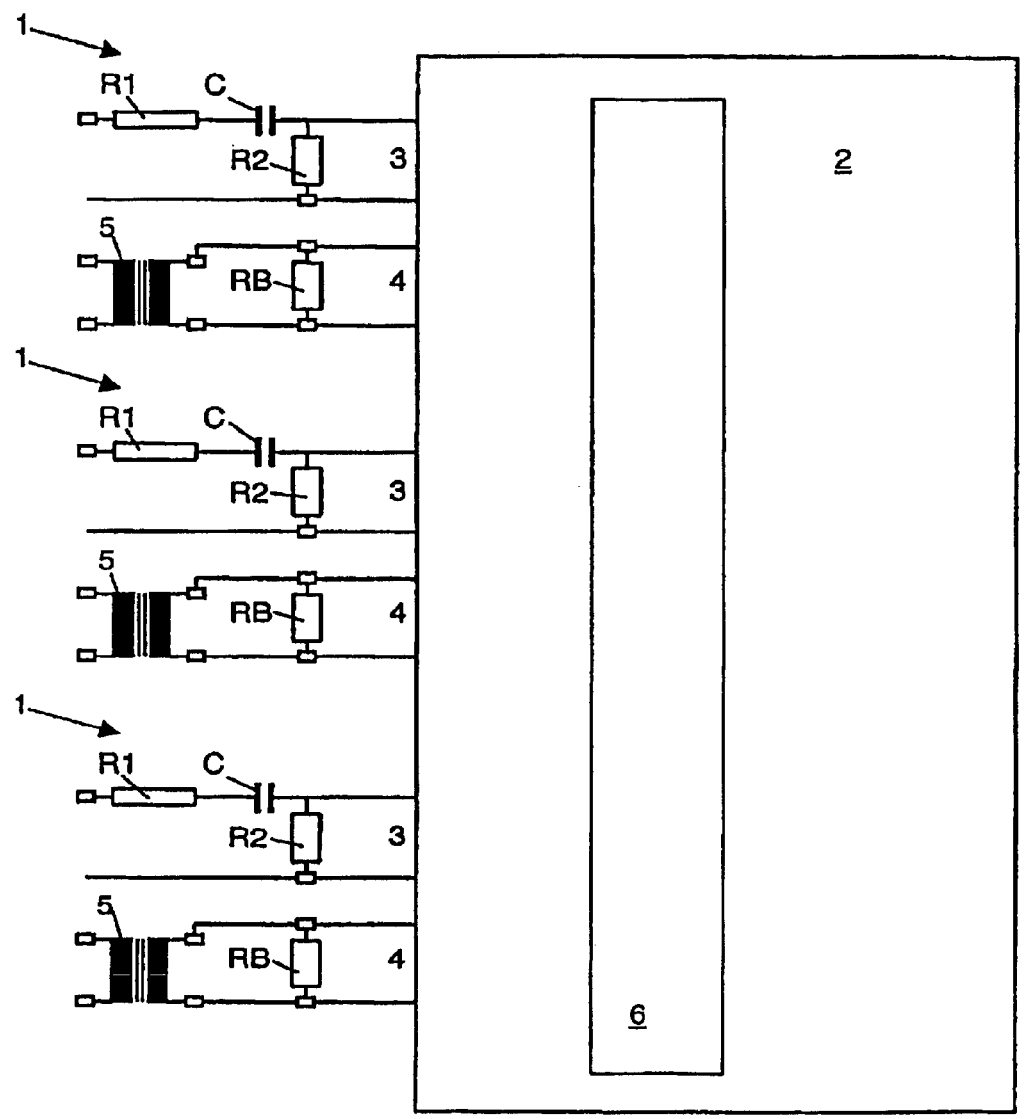
FIG.

COMPENSATION CIRCUIT FOR THE PHASE SHIFT IN ELECTRIC METERS FOR DIRECT CONNECTION

The invention is to be allocated to the domain of metering technology. It concerns a compensation circuit for the phase shift between the voltage determination and the current determination in electricity meters for direct connection.

STATE OF THE ART

In industrial's applications electronic electricity meters have already became extensively accepted to a large extent because of their advantages compared to electromechanical meters. The connection of these industrial meters occurs as is well known indirectly, thus by current converter respectively voltage converter, which exhibit adequate and conforming to standards characteristics. As outstanding characteristics of electronic meters are to be cited above all the possibility of remote readability, the maintenance-free operation, the smaller equipment's dimension, the higher accuracy and the extended current range.

With regard to these obvious advantages compared to electromechanical meters, the adoption of electronic electricity meters gains increasingly also in households in importance. A fundamental difference between these household meters and the industrial meters mentioned above is to be seen in their installation arrangement. So household meters are typically directly connected; this means that they are directly connected to the line to the attached load. Thereby, a key role is given to the current determination, since here the potential separation to the meters takes place and, in addition, high requirements are set for these meters in accordance with the international norm IEC 1036. The conforming to standards requirements of accuracy in the current determination and in the voltage determination comprise a small amplitude error (<1%), a small phase error (<0.3°) and a small linearity distortion. Furthermore, a DC-tolerance of $I_{max}/\pi$ must be achieved in accordance with the mentioned norm; that means that such an electronic electricity meter by mixed current loading muss be able to be further measured in conformity with standards with a DC component $\leq I_{max}/\pi$. These electronic electricity meters for direct connection may thus not be brought in saturation through the DC component from to $I_{max}/\pi$, but must self still be in the position of being able to illustrate, even during such a DC bias, the alternating component of the load current up to $I_{max}$.

DC-tolerant converter with a direct current resistance up to $I_{max}/\pi$ are indeed well-known, however they do not fulfil the requirements to a maximal admissible phase shift, since with them phase shifts between current measured values and voltage measured values of up to 5° can occur. A correction by means of time lag, as it is described for example in the DE 196 39 410 A1, can create only limited remedy here. Since household meters are mass products, economic factors are of special importance for the selection of all components. Therefore, a correction of the phase shift, such correction being installed in conventional meters, is only possible within narrow boundaries by means of time lag, and moreover this correction is not coupled to the frequency by means of time lag, so that this correction is for itself regarded as frequency-dependant and thus limited.

So long, however, that DC currents in connection with the energy allocation must not be measured from the meters, but if need be it must be "absorbed", the technology of the transformational acting current detectors will be lasting—in particular because of its simple, low-priced and robust execution.

PRESENTATION OF THE INVENTION

It is therefore a task of the invention to indicate a compensating circuit for the phase shift in electricity meters of the kind mentioned above, which is also able, in the case of mixed current loading, to cope with the standard limit values of a DC admission without prejudice and at the same time of correctly seizing, within the standards given, active output respectively reactive power with all usual operating power frequencies.

Furthermore, the task of the invention consists therein that this compensation circuit should be robust and in addition, it should be simple and low-priced producible in the sense of a mass application.

The task of the invention is solved through the characteristics of the claim 1. Further favourable arrangements of the invention are objects of the under mentioned claims.

The core of the invention is to be seen in the fact that in electricity meters for direct connection, which nowadays tolerate, by means of a DC-tolerant converter, a conforming to standards mixed current loading without prejudice, a frequency-independant compensation of a phase shift between the current determination and the voltage determination is obtained with the help of a high pass filter in voltage path. A conventional, DC-tolerant converter in voltage path affects a frequency-dependant phase shift through its high pass characteristic, and such frequency-dependant phase shift is compensated through a likewise frequency-dependant phase shift of the high pass filter in voltage path. Since the high pass characteristic of the high pass filter is adapted to the high pass characteristic of the DC-tolerant converter, the compensation of the activated phase shift occurs thus advantageously frequency-independant.

A particularly favourable arrangement of the invention provides that the high pass filter comprises a resistance and a capacitor, since such a high pass filter is simple, low-priced and robust.

It is of advantage if, between the high pass filter and the input for the voltage determination, a further resistance is arranged for the purpose of a voltage division. Furthermore, a burden resistance is provided for the purpose of a current-voltage transformation advantageously between the DC-tolerant converter and the input for the current determination.

With advantage, the two inputs for the current determination respectively voltage determination are connected with a measuring chip, which is taking care by means of a programmable correction device for a further calibration of a phase compensation between current and voltage. A particularly simple and low-priced correction device causes within narrow boundaries and as required merely a retardation respectively a lag or however an advance of the voltage levels compared to the current levels in dependence of the before nominated phase compensation by means of a high pass filter. The high pass filter can thereby be in such a way selected that it achieves a global calibration in the form of a minimum calibration, so that the correction device of the measuring chip is self in the position of being able to carry out the residual phase compensation by means of a retardation, or however, the high pass causes a global calibration in the form of a medium calibration in the compensation range of the correction device of the measuring chip.

By the term DC-tolerant converter is understood a current converter, and such current converter is in a position of being able, according to norms, to tolerate a DC admission from up to $I_{max}/\square$ without prejudice, i.e. that such a DC-tolerant converter does not self go into saturation in the case of a mixed current loading with a continuous component of $I_{max}/\square$ and transfers quasi error free the alternating component to be measured up to a phase shift.

The employment of the compensation circuit in accordance with the invention allows even the use of conventional measuring chips, which are not in a position of being able from themselves to correct phase shifts, as they can occur in connection with DC-tolerant converters. This compensation circuit enables thus the usage in conformity to standards of conventional measuring chips in connection with these DC-tolerant converters.

SHORT DESCRIPTION OF THE DRAWING

In the drawing is represented an embodiment example in a schematic and simplified way.

It shows the only one FIGURE a compensation circuit according to the invention for electronic electricity meters for direct connection.

METHODS TO THE EXECUTION OF THE INVENTION

In the only FIGURE, a measurement circuit arrangement 1 is represented, which exhibits for each phase of a three-phase network in each case an input 3 for the voltage determination and an input 4 for the current determination. All inputs 3, 4 for the voltage determination respectively current determination are connected with a measuring chip 2, which comprises a correction device 6 for the purpose of a phase compensation. Before each input 3 for the voltage determination, a high pass filter, consisting of a resistance R1 and a capacitor C, is arranged, and such high pass filter can be supplemented by a further resistance R2 for the purpose of voltage division to this input 3. A DC-tolerant converter 5 is advanced before each input 4 for the current determination; to the DC-tolerant converter 5, for the purpose of transformation of a current signal into a voltage signal, a burden resistance RB can be topped.

The measurement circuit arrangement 1 with topped measuring chip 2 as exemplified based on the FIGURE, represents a circuit for measuring voltage signals and current signals for an electricity meter for direct connection. Such electricity meters are employed in households, i.e. that these electricity meters are manufactured as mass products under adequate economic points of view. They must be robust in relation to surroundings (heating cellar installation, cellar installation, storey installation), simply producible and low-priced.

The DC-tolerant converter 5 in path of the current shows good characteristics with regard to robustness and economy, however it exhibits likewise an unwanted large phase angle shift between the transformed current signal and the voltage signal seized by the input 3. This phase shift is on the one hand frequency-dependant and on the other hand, to a large extent, independent in the to be measured current range from the intensity of current, so that by means of the high pass filter R1, C before the input 3 for the voltage determination an accordingly adapted—also frequency-dependant phase shift can be provoked, whereby an essentially frequency-independant phase compensation between the current determination and the voltage determination takes place.

This high pass supported phase compensation is displayed in such a manner that it reaches into the range of the possible phase compensation of the correction device 6 of the measuring chip 2. A layout of the high pass supported phase compensation provides for the fact that this calibration reaches as minimal minimum calibration up to the lower range edge of the phase compensation of the correction device 6 or however, in a further layout, it extends into the centre of this range of the phase compensation of the correction device 6 as central calibration. In both layout cases, it concerns however frequency-independant global calibrations, with which the substantial part of the phase compensation between current determination and voltage determination is undertaken.

The further phase compensation is then executed by the correction device 6 of the measuring chip 2. Since this part of the phase compensation is small in comparison to the high pass supported phase compensation, it can be accepted that the phase compensation is frequency-dependant by means of the correction device 6. A simple execution of the correction device 6 provides for a programmable retardation, which is realised by means of a software. As a matter of course is also imaginable in the sense of the invention a further phase compensation through the correction device 6, such further phase compensation being realised by means of elements.

Furthermore, the three-phase arrangement of a measurement circuit arrangement being shown into the FIGURE, can also be implemented merely single-phase, without that an inventive service must be performed. In the sense of the invention it is likewise conceivable that instead of the shown high pass filter, consisting of R1, C, is for example employed a R-L-filter before the input 3 for the voltage determination.

REFERENCE SYMBOL LIST

1 measurement circuit arrangement
2 measuring chip
3 input for voltage determination
4 input for current determination
5 DC-tolerant converter
6 correction device
R1 resistance
R2 resistance
C capacitor

What is claimed is:

1. Compensation circuit for the phase shift between a first input (3) for a voltage determination and a second input (4) for a current determination in electricity meters for direct connection, whereby a DC-tolerant converter (5) is arrange before this second input (4), characterized by the fact that for the voltage determination, a high pass filter (R1, C) is arranged before the first input (3) for a first calibration of a frequency-independent phase compensation.

2. Compensation circuit according to claim 1, characterized by the fact that the high pass filter (R1, C) comprises a first resistance (R1) and a capacitor (C) in series connection.

3. Compensation circuit according to claim 1, characterized by the fact that between the high pass filter (R1, C) and the first input (3) for the voltage determination, a second resistance (R2) is arranged for voltage division in parallel connection.

4. Compensation circuit according to claim 1, characterized by the fact that between the DC-tolerant converter (5) and the second input (4) a burden resistance (RB) is arranged for the current determination.

5. Compensation circuit according to claim 1, characterized by the fact that a frequency-dependent phase shift of the high pass filter (Ra, C) is approximately equal to a frequency-dependent phase shift of the DC-tolerant converter (5).

6. Compensation circuit according to claim 1, characterized by the fact that a measuring chip (2) is connected with the first and second input (3, 4), whereby this measuring chip (2) exhibits a programmable correction device (6) for a second calibration of the phase compensation between the voltage determination and the current determination.

7. Compensation circuit according to claim 6, characterized by the fact that the second calibration of the phase compensation is frequency-dependent.

8. Compensation circuit according to claim 2, characterized by the fact that between the high pass filter (R1, C) and the first input (3) for the voltage determination, a second resistance (R2) is arranged for voltage division in parallel connection.

9. Compensation circuit according to claim 2, characterized by the fact that between the DC-tolerant converter (5) and the second input (4) a burden resistance (RB) is arranged for the current determination.

10. Compensation circuit according to claim 3, characterized by the fact that between the DC-tolerant converter (5) and the second input (4) a burden resistance (RB) is arranged for the current determination.

11. Compensation circuit according to claim 2, characterized by the fact that a frequency-dependent phase shift of the high pass filter (Ra, C) is approximately equal to a frequency-dependent phase shift of the DC-tolerant converter (5).

12. Compensation circuit according to claim 3, characterized by the fact that a frequency-dependent phase shift of the high pass filter (Ra, C) is approximately equal to a frequency-dependent phase shift of the DC-tolerant converter (5).

13. Compensation circuit according to claim 4, characterized by the fact that a frequency-dependent phase shift of the high pass filter (Ra, C) is approximately equal to a frequency-dependent phase shift of the DC-tolerant converter (5).

14. Compensation circuit according to claim 2, characterized by the fact that a measuring chip (2) is connected with the first and second input (3, 4), whereby this measuring chip (2) exhibits a programmable correction device (6) for a second calibration of the phase compensation between the voltage determination and the current determination.

15. Compensation circuit according to claim 3, characterized by the fact that a measuring chip (2) is connected with the first and second input (3, 4), whereby this measuring chip (2) exhibits a programmable correction device (6) for a second calibration of the phase compensation between the voltage determination and the current determination.

16. Compensation circuit according to claim 4, characterized by the fact that a measuring chip (2) is connected with the first and second input (3, 4), whereby this measuring chip (2) exhibits a programmable correction device (6) for a second calibration of the phase compensation between the voltage determination and the current determination.

17. Compensation circuit according to claim 5, characterized by the fact that a measuring chip (2) is connected with the first and second input (3, 4), whereby this measuring chip (2) exhibits a programmable correction device (6) for a second calibration of the phase compensation between the voltage determination and the current determination.

* * * * *